(12) United States Patent
Shen et al.

(10) Patent No.: US 9,660,668 B2
(45) Date of Patent: May 23, 2017

(54) FORWARD ERROR CORRECTION (FEC) FOR LOCAL AREA NETWORKS (LANS)

(71) Applicant: BROADCOM CORPORATION, Irvine, CA (US)

(72) Inventors: Ba-Zhong Shen, Irvine, CA (US); Mehmet Vakif Tazebay, Irvine, CA (US); William Gene Bliss, Granite Canon, WY (US); Ahmad Chini, Mission Viejo, CA (US); Mehdi Tavassoli Kilani, Aliso Viejo, CA (US)

(73) Assignee: Avago Technologies General IP (Singapore) Pte. Ltd, Singapore (SG)

( * ) Notice: Subject to any disclaimer, the term of this patent is extended or adjusted under 35 U.S.C. 154(b) by 132 days.

(21) Appl. No.: 14/656,839

(22) Filed: Mar. 13, 2015

(65) Prior Publication Data
US 2015/0263762 A1    Sep. 17, 2015

Related U.S. Application Data

(60) Provisional application No. 61/953,116, filed on Mar. 14, 2014.

(51) Int. Cl.
*H03M 13/11* (2006.01)
*H04L 1/00* (2006.01)
*G05D 1/08* (2006.01)
*H03M 13/35* (2006.01)
*H03M 13/37* (2006.01)
(Continued)

(52) U.S. Cl.
CPC ....... *H03M 13/1111* (2013.01); *B64C 13/503* (2013.01); *G05D 1/0808* (2013.01); *H03M 13/116* (2013.01); *H03M 13/353* (2013.01);
*H03M 13/3715* (2013.01); *H03M 13/6337* (2013.01); *H03M 13/658* (2013.01); *H03M 13/6583* (2013.01); *H03M 13/6591* (2013.01);
(Continued)

(58) Field of Classification Search
CPC ...................................................... H03M 13/11
USPC .......................... 714/758, 794, 795, 796, 704
See application file for complete search history.

(56) References Cited

U.S. PATENT DOCUMENTS 5,745,479 A * 4/1998 Burns ................... H04L 1/0083
370/245
8,483,328 B2 * 7/2013 van Nee ........... H04L 25/03006
375/259
(Continued)

*Primary Examiner* — Fritz Alphonse
(74) *Attorney, Agent, or Firm* — Garlick & Markison; Shayne X. Short

(57) ABSTRACT

A local area network (LAN) backbone is implemented within an environment such as a self-contained environment (e.g., an automobile, an aircraft, a train, a ship, and/or any other environment). The LAN backbone is affected by AWGN, NBI, and/or impulse noise (noise). The LAN backbone supports communications based on an Ethernet communication protocol (e.g., a 1000Base-T1 based system that includes at least one single twisted pair). A device receives a first LDPC coded signal via the LAN backbone and decodes it to recover an input signal of a control system. The device also uses soft information generated during the decoding to compensate for the noise affecting the LAN backbone and then processes the input signal to generate a control signal for the control system. The device then and encodes the control signal to generate a second LDPC coded signal and transmits the second LDPC coded signal via the LAN backbone.

20 Claims, 8 Drawing Sheets

(51) Int. Cl.
*H03M 13/00* (2006.01)
*B64C 13/50* (2006.01)
*G01S 17/88* (2006.01)

(52) U.S. Cl.
CPC .......... *H04L 1/0045* (2013.01); *H04L 1/0057* (2013.01); *G01S 17/88* (2013.01)

(56) References Cited

U.S. PATENT DOCUMENTS

| | | |
|---|---|---|
| 9,088,310 B2 * | 7/2015 | Nielsen |
| 2005/0149843 A1 * | 7/2005 | Shen ........................ H03M 5/20 |
| | | 714/800 |
| 2008/0165874 A1 * | 7/2008 | Steele .................... H04L 1/0026 |
| | | 375/261 |
| 2014/0153673 A1 * | 6/2014 | Shen ................. H04L 25/03318 |
| | | 375/320 |

* cited by examiner

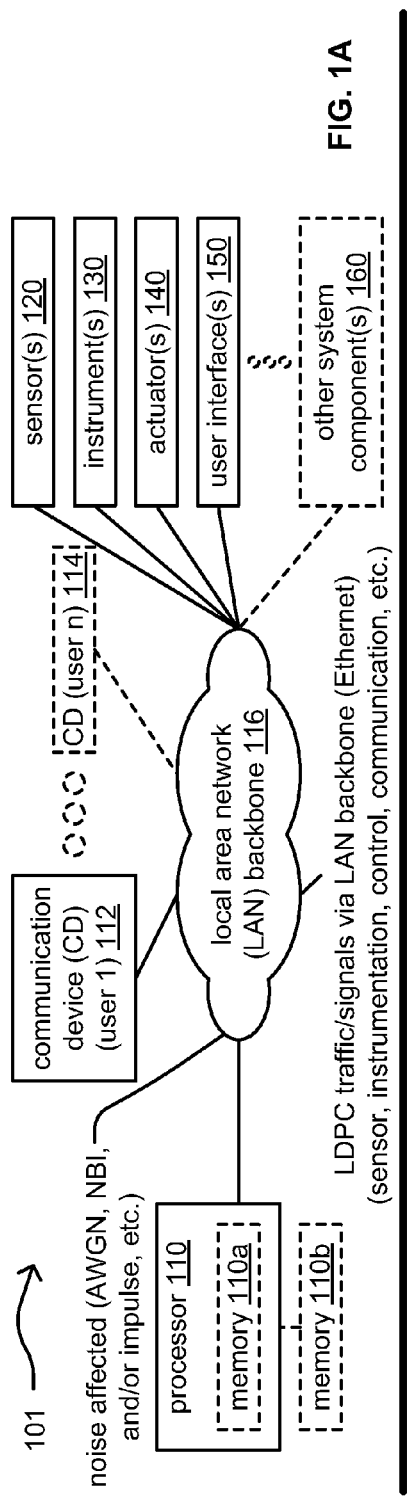
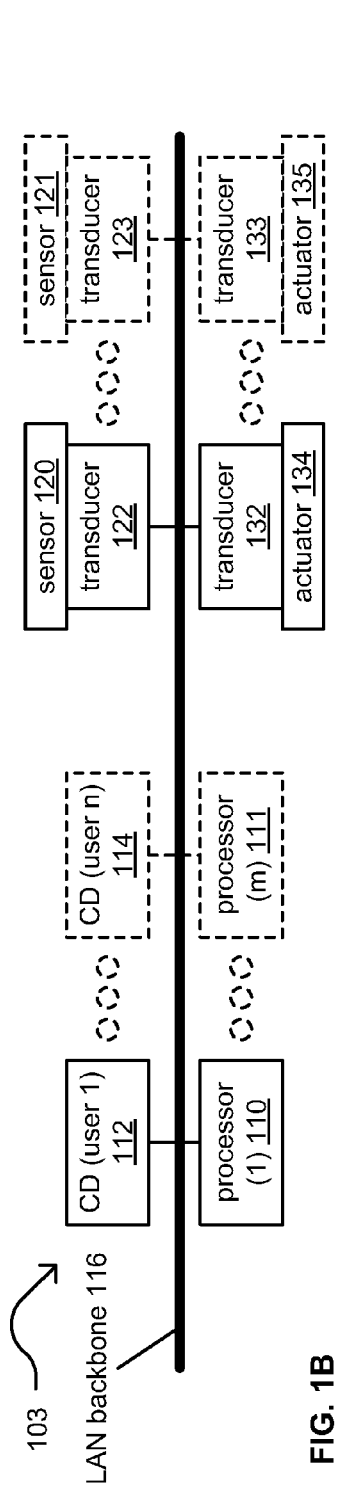
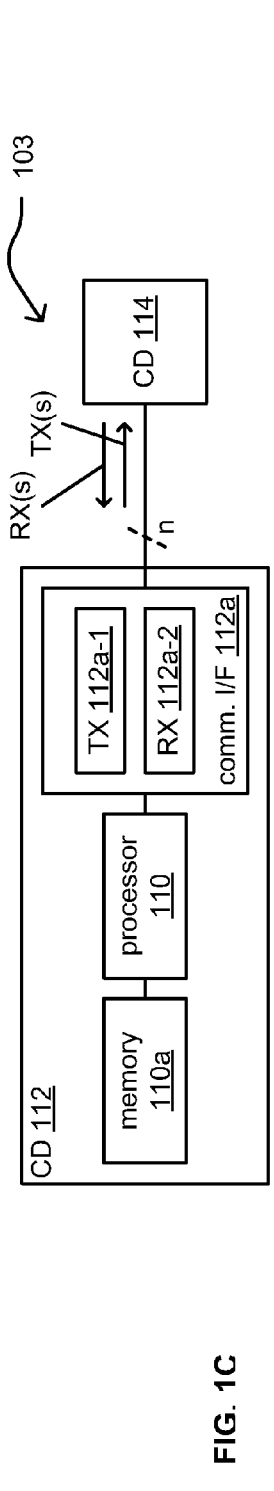

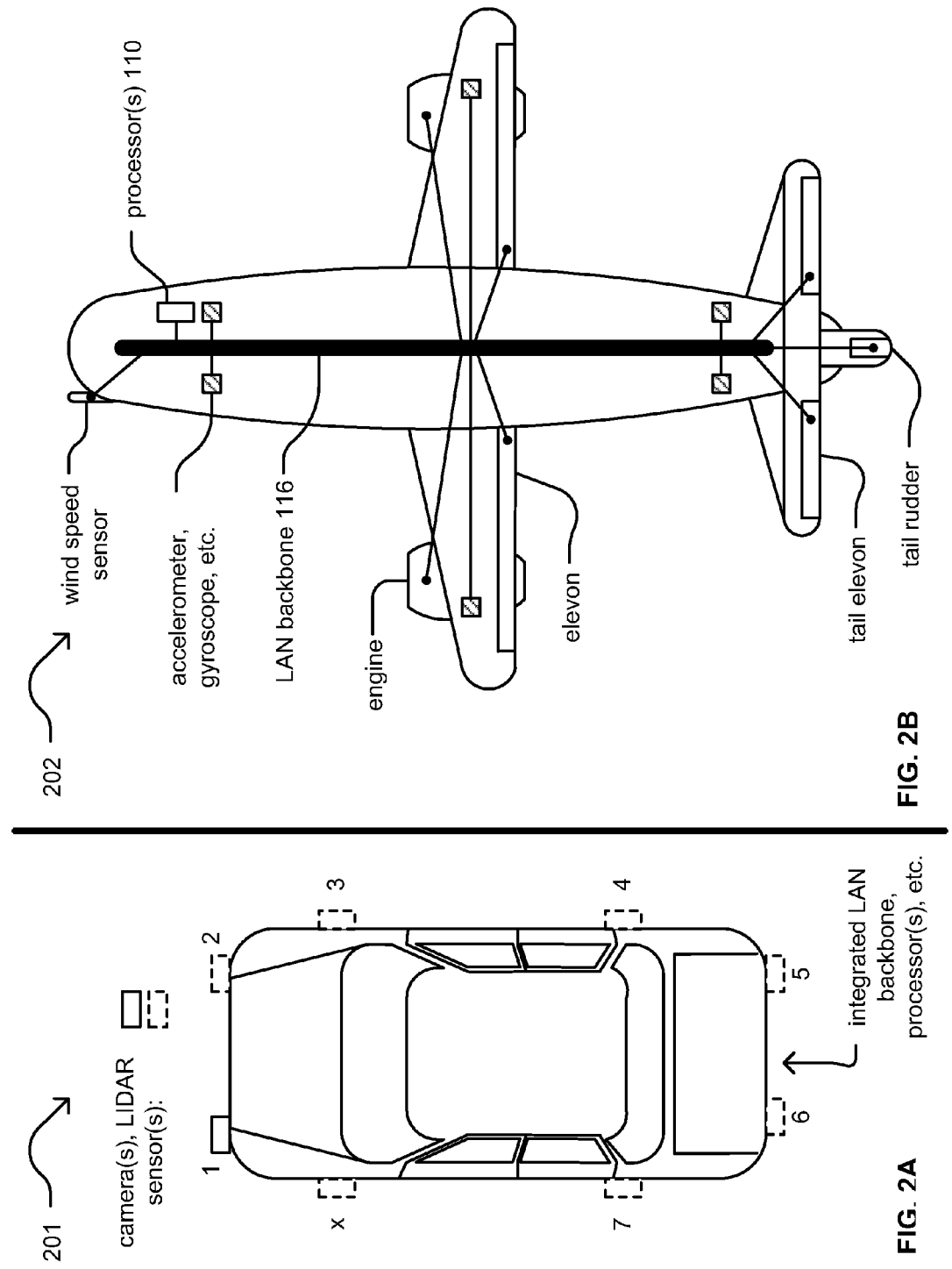

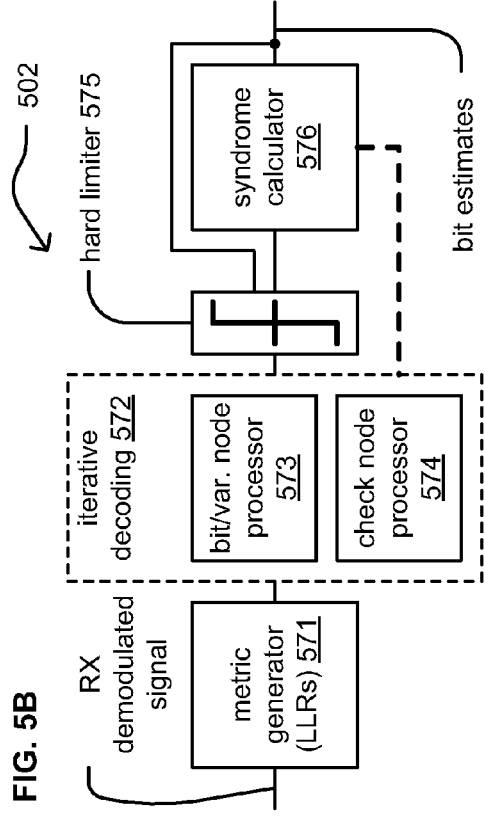
FIG. 5A
FIG. 5B
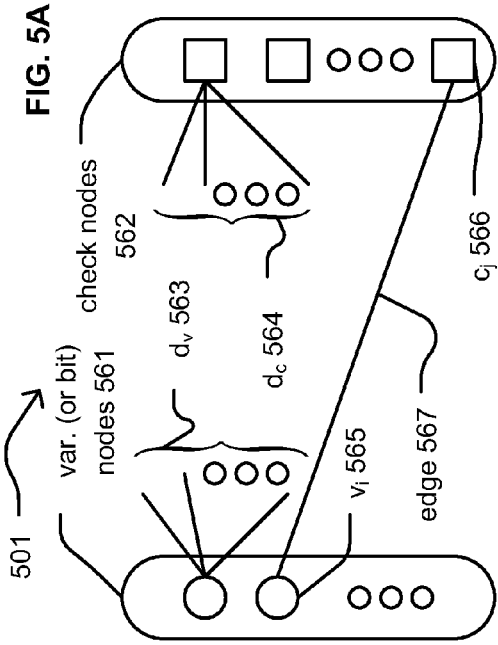
FIG. 5C

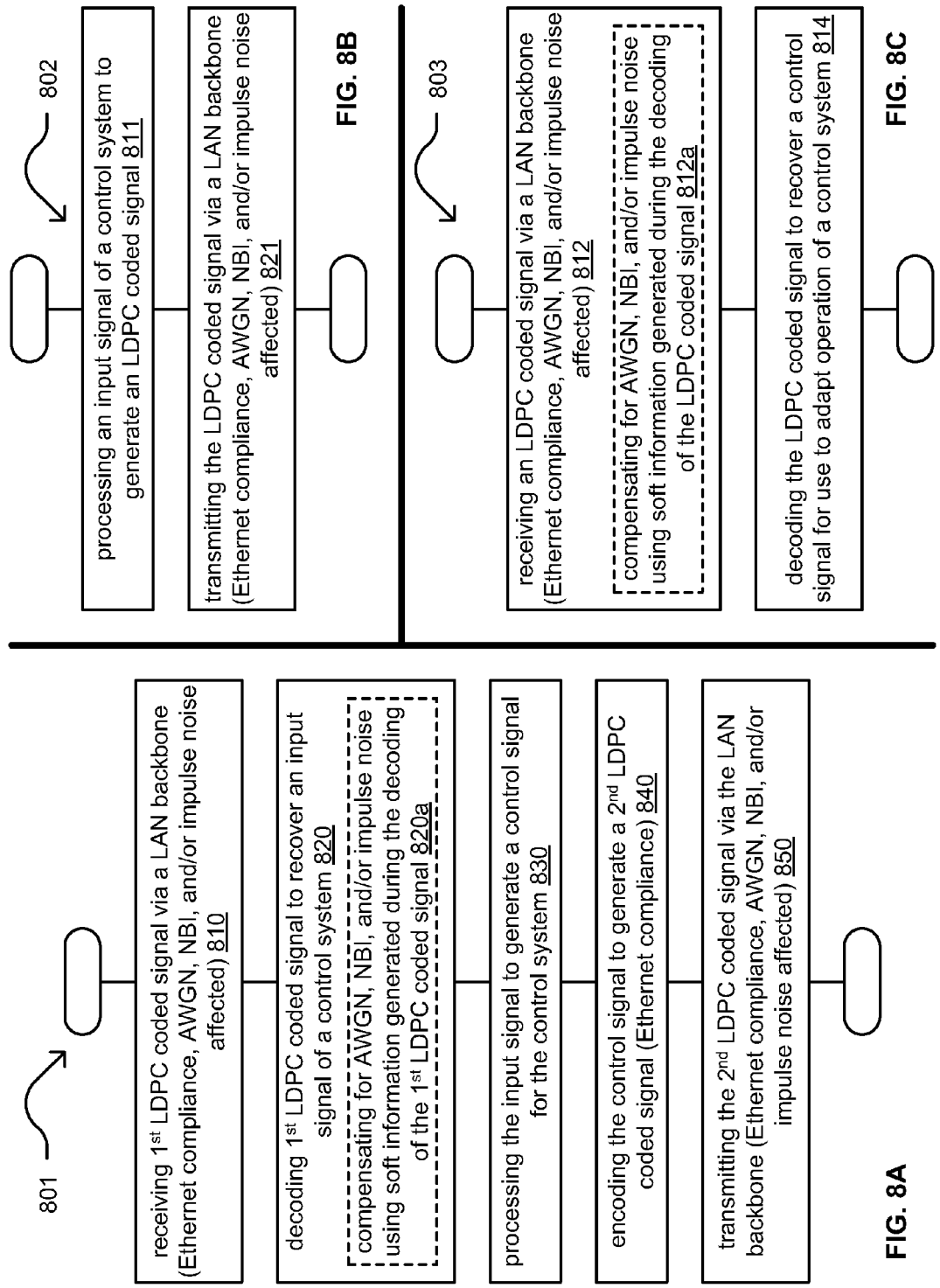

FORWARD ERROR CORRECTION (FEC) FOR LOCAL AREA NETWORKS (LANS)

CROSS REFERENCE TO RELATED PATENTS/PATENT APPLICATIONS

Provisional Priority Claim

The present U.S. Utility patent application claims priority pursuant to 35 U.S.C. §119(e) to U.S. Provisional Application No. 61/953,116, entitled "Forward error correction (FEC) for local area networks (LANs)," filed Mar. 14, 2014, which is hereby incorporated herein by reference in its entirety and made part of the present U.S. Utility patent application for all purposes.

BACKGROUND

Technical Field

The present disclosure relates generally to communication systems; and, more particularly, to forward error correction (FEC) coding and/or error correction code (ECC) coding and signaling within such communication systems.

Description of Related Art

Data communication systems have been under continual development for many years. The primary goal within such communication systems is to transmit information successfully between devices. Unfortunately, many things can deleteriously affect signals transmitted within such systems resulting in degradation of or even complete failure of communication. Examples of adverse effects include interference and noise that may be caused by various sources including other communications, low-quality links, degraded or corrupted interfaces and connectors, etc.

Some communication systems use forward error correction (FEC) coding and/or error correction code (ECC) coding to increase the reliability and the amount of information that may be transmitted between devices. When a signal incurs one or more errors during transmission, a receiver device can employ the FEC or ECC coding to try to correct those one or more errors.

A continual and primary directive in this area of development has been to try continually to lower the signal to noise ratio (SNR) required to achieve a given bit error ratio (BER) or symbol error ratio (SER) within a communication system. The Shannon limit is the theoretical bound for channel capacity for a given modulation and code rate. The ideal goal has been to try to reach Shannon's channel capacity limit in a communication channel. Shannon's limit may be viewed as being the data rate per unit of bandwidth (i.e., spectral efficiency) to be used in a communication channel, having a particular SNR, where transmission through the communication channel with arbitrarily low BER or SER is achievable.

Certain applications are better suited for certain types of FEC and/or ECC coding. Prior art systems often follow and traditional approaches that are not well suited to deal with the problems that can adversely affect a communication system. As such, the performance of these prior art systems is less than optimal. There continues to be a need in the art for better selected and applied FEC and/or ECC coding for certain types of communication systems to improve performance therein.

BRIEF DESCRIPTION OF THE SEVERAL VIEWS OF THE DRAWINGS

FIG. 1A is a diagram illustrating an embodiment of one or more communication systems serviced using a local area network (LAN) backbone.

FIG. 1B is a diagram illustrating another embodiment of one or more communication systems serviced using a LAN backbone.

FIG. 1C is a diagram illustrating an example of a communication device (CD) operative within one or more communication systems.

FIG. 2A is a diagram illustrating an embodiment of one or more communication systems serviced using a LAN backbone within an automobile.

FIG. 2B is a diagram illustrating an embodiment of one or more communication systems serviced using a LAN backbone within an aircraft.

FIG. 5A illustrates an example of an LDPC (Low Density Parity Check) code bipartite graph.

FIG. 5B illustrates an example of decoding of an LDPC coded signal.

FIG. 5C illustrates an example of an LDPC matrix that is partitioned into sub-matrices.

FIG. 8A is a diagram illustrating an embodiment of a method for execution by one or more communication systems.

FIG. 8B is a diagram illustrating another embodiment of a method for execution by one or more communication systems.

FIG. 8C is a diagram illustrating another embodiment of a method for execution by one or more communication systems.

DETAILED DESCRIPTION

Figure 3A:
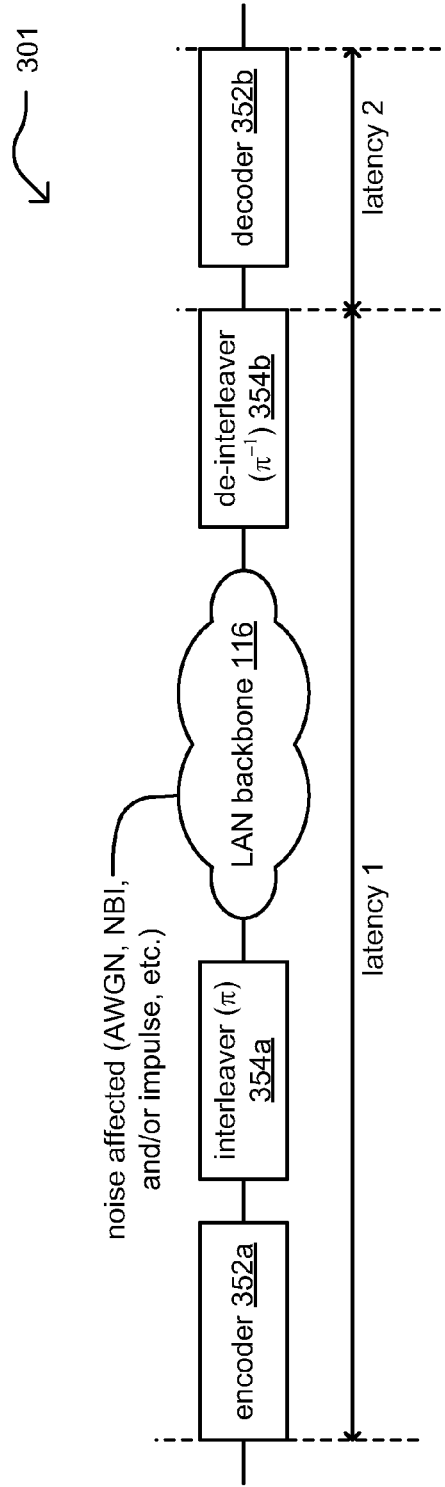
FIG. 3A is a diagram illustrating an example of latency in a communication system.

FIG. 1A is a diagram illustrating an embodiment 101 of one or more communication systems serviced using a local area network (LAN) backbone. The communication system infrastructure includes one or more of: one or more communication devices (e.g., such as communication device (CD) 112 up to CD 114, and each CD may be associated with a respective user such as CD 112 associated with a user 1, and up to CD 114 associated with a user n, where n is a positive integer greater than or equal to 2, etc.), one or more processors (e.g., such as processor 110), one or more sensors 120, one or more instruments 130, one or more actuator 140, one or more user interfaces 150, and/or one or more other system components 160.

The communication devices, processors, components, and/or other elements (e.g., alternatively generally referred to as devices in some examples) are able to communicate with one another via a local area network (LAN) backbone 116. The LAN backbone 116 supports communications between devices that have been encoded using one or more forward error correction (FEC) and/or error correction code (ECC) coding scheme. The LAN backbone 116 also is implemented to support communications based on one or more Ethernet protocols (e.g., including those based on any version or amendment of the IEEE 802.3 Ethernet networking standard, any of various proprietary Ethernet type codes or standards, and/or any other Ethernet-based communication protocol, communication standard, and/or recommended practice). Note also that any of these devices may include the appropriate circuitry, capability, and/or functionality to interface with the LAN backbone 116. For example, certain of the devices in communication with the LAN backbone 116 may internally operate based on a non-Ethernet basis, and any of these devices may include capability to transform signals to and from the Ethernet communication protocol of the LAN backbone 116 (e.g., transform non-Ethernet-based signals to Ethernet-based signals and vice versa). Alternatively, a device external to one of these devices may operate perform such transformation to and from the Ethernet communication protocol of the LAN backbone 116.

Note that the CDs 112, 114, and/or the processor 110 may also include memory (e.g., such as memory 110*a* optionally shown within processor 110 or memory 110*b* optionally shown external to processor 110) to store information including one or more types of encoding, one or more types of symbol mapping, concatenation of various modulation coding schemes, etc. as may be generated by the respective element associated with that memory or such information received from other devices via one or more communication channels. Note alternatively that such a memory may be external to the element (e.g., such as memory 110*b* optionally shown external to processor 110). The memory may also include and store various operational instructions for use by the associated CDs 112, 114, and/or the processor 110 in regards to perform signal processing based on any one or more other FECs, ECCs, etc. In some examples, low density parity check (LDPC) FEC coding and/or ECC coding is used for encoding/decoding of such signals communicated between the devices via the LAN backbone 116. The memory may also include and store information related to the particular type of one or more other FECs, ECCs, etc. and/or other coding such as may be used in performing signal processing as described herein.

Note that while many of the devices will be stationary and communicate via the LAN backbone 116 using wired means, some devices may alternatively be mobile devices that include capability to communicate via the LAN backbone 116 using wired means and/or wireless means (e.g., such as via another wireless device that interfaces with the LAN backbone 116 using wired means). Each of the communication devices 112, 114 may be stationary or mobile devices. For example, a mobile communication device 112, 114 is one of a cellular telephone, a tablet, a laptop computer, a video game console, a remote controller, a multimedia (e.g., audio and/or video) player, etc. As another example, a stationary communication device is a device that, while it can be moved, is generally used at a fixed location such as a computer, an access point, etc.

In an example of operation, the CD 112 includes a communication interface and a processor configured to perform operations including to receive a first low density parity check (LDPC) coded signal that is compliant with an Ethernet communication protocol via the LAN backbone 116 that supports communications based on the Ethernet communication protocol and that is affected by additive white Gaussian noise (AWGN), narrowband interference (NBI), and/or impulse noise. The CD 112 decodes the first LDPC coded signal to generate soft information and employs the soft information to compensate for the AWGN, the NBI, and the impulse noise and to recover an input signal of a control system. The CD 112 then processes the input signal of the control system to generate a control signal for the control system and encodes the control signal of the control system to generate a second LDPC coded signal that is compliant with the Ethernet communication protocol. The CD 112 then transmits the second LDPC coded signal via the LAN backbone.

Note that multiple systems (or sub-systems) of various types may all be serviced by the LAN backbone 116. These various systems (or sub-systems) may be implemented to communicate with one another via the LAN backbone 116. In general, the LAN backbone 116 serves as the basis for one or more of the various systems (or sub-systems) to communicate within the particular application or system in which the LAN backbone 116 is implemented.

Generally speaking, any of the circuitries, components, elements, etc. that generate signals for or receive signals from the LAN backbone 116 include communication interface circuitry, functionality, and/or capability, etc. to perform any such operations of an analog front end (AFE) and/or physical layer (PHY) transmitter, receiver, and/or transceiver. Examples of such operations may include any one or more of various operations including conversions between the frequency and analog or continuous time domains (e.g., such as the operations performed by a digital to analog converter (DAC) and/or an analog to digital converter (ADC)), gain adjustment including scaling, filtering (e.g., in either the digital or analog domains), frequency conversion (e.g., such as frequency upscaling and or frequency downscaling, such as to a baseband frequency at which one or more of the elements operates), equalization, pre-equalization, metric generation, symbol mapping and/or de-mapping, automatic gain control (AGC) operations, and/or any other operations that may be performed by an AFE and/or PHY component within the element.

FIG. 1B is a diagram illustrating another embodiment 102 of one or more communication systems serviced using a LAN backbone. The embodiment 102 also includes an implementation of the backbone 116. The embodiment 102 may include one or more CDs 112-114 (e.g., such as associated with user 1 through user n, where n is a positive integer greater than or equal to 2), one or more processors 110-111 (e.g., processors 1-*m*, where m is a positive integer greater than or equal to 2), one or more sensors 120-121, one or more actuators 134-135, etc. Note that the embodiment 102 includes a corresponding and respective transducer that interfaces each of the one or more sensors 120-121 and the one or more actuators 134-135 with the LAN backbone 116.

For example, transducer 122 transforms signals to and from the Ethernet communication protocol of the LAN backbone 116 for the sensor 120 (e.g., transform non-Ethernet-based signals to Ethernet-based signals and vice versa). In general, a sensor generates an input signal based on an operational parameter that is being monitored, sensed, etc. (e.g., a speed sensor/speedometer monitors the operational parameter of velocity/speed, an altimeter sensor monitors the operational parameter of altitude, an aircraft air pressure monitors the operational parameter of air pressure inside and/or outside of the aircraft, etc.) The transducers 123, 132, and 133 perform analogous and respective operations for each of the sensor 121, the transducer 132, and the transducer 133, respectively. Note that other examples may not particularly require external transducers as certain of the sensors and/or transducers may include such functionality internally to perform interfacing with the LAN backbone 116.

In an example operation, transducer 122 processes an input signal of a control system (e.g., such as received from sensor 120) to generate a first LDPC coded signal that is compliant with the Ethernet communication protocol. The transducer 122 transmits the first LDPC coded signal that is compliant with the Ethernet communication protocol via the LAN backbone 116. The processor 110 or CD 112 receives the second LDPC coded signal that is compliant with the Ethernet communication protocol via the LAN backbone decodes the second LDPC coded signal to recover the control signal for use to adapt operation of the control system. The processor 110 or CD 112 also uses soft information generated during decoding of the second LDPC coded signal to compensate for the AWGN, the NBI, and the impulse noise affecting the LAN backbone and to recover the control signal.

In another example of operation, the transducer 132 receives (e.g., from the processor 110) the second LDPC coded signal that is compliant with the Ethernet communication protocol via the LAN backbone and decodes the second LDPC coded signal to recover the control signal for use to adapt operation of the control system (e.g., such as for use by actuator 134) and may also operate to use other soft information generated during decoding of the second LDPC coded signal to compensate for the AWGN, the NBI, and the impulse noise affecting the LAN backbone and thereby affecting the signal transmitted via the LAN backbone.

Note that various types of control systems may be included within a variety of applications including automotive-based applications, aircraft-based applications, etc. Any of such applications may unfortunately be susceptible to one or more types of noises, interferences, etc. (e.g., AWGN, NBI, and/or impulse noise).

Generally speaking, the embodiments 101 and 102 show examples in which LAN backbone 116 is implemented to support Ethernet-based communications in accordance with an Ethernet communication protocol. Note that certain example implementations include one or more communication systems implemented within a self-contained environment (e.g., within an automobile, within an aircraft, within a boat, within the ship, within a train, within a bus, and/or any other application that includes a LAN backbone 116 that is implemented to support communications between devices within that self-contained environment). Note that certain devices within that self-contained environment may communicate externally (e.g., an automobile may include cellular, satellite, and/or wireless local area network (WLAN/WiFi) communication capability to communicate with devices that are external to the automobile, but the LAN backbone 116 serves to support communications within the automobile).

FIG. 1C is a diagram illustrating an example 103 of a communication device (CD) operative within one or more communication systems. The CD 112 includes a communication interface 112a and a processor 110. The communication interface 112a includes functionality of a transmitter 112a-1 and a receiver 112a-2 to support communications with one or more other devices within a communication system (e.g., any of the communication devices, processors, components, and/or other elements of FIG. 1A in communication, connection, and/or coupling with the CD 112 via a LAN backbone). The CD 112 may also include memory 110a to store information including one or more signals generated by the CD 112 or such information received from other devices via one or more communication channels. Memory 110a may also include and store various operational instructions for use by the processor 110 in regards to the processing of messages and/or other received signals and generation of other messages and/or other signals including those described herein. Examples of such signals and messages include LDPC coded signals. Memory 110a may also store information including one or more types of encoding, one or more types of symbol mapping, concatenation of various modulation coding schemes, etc. as may be generated by the CD 112 or such information received from other devices via one or more communication channels. The communication interface 112a supports communications to and from one or more other devices (e.g., CD 112 and/or other communication devices). Operation of the communication interface 112a may be directed by the processor 110 such that processor 110 transmits and receives signals (TX(s) and RX(s)) via the communication interface 112a.

Generally speaking, the communication interface 112a is implemented to perform any such operations of an analog front end (AFE) and/or physical layer (PHY) transmitter, receiver, and/or transceiver. Examples of such operations may include any one or more of various operations including conversions between the frequency and analog or continuous time domains (e.g., such as the operations performed by a digital to analog converter (DAC) and/or an analog to digital converter (ADC)), gain adjustment including scaling, filtering (e.g., in either the digital or analog domains), frequency conversion (e.g., such as frequency upscaling and or frequency downscaling, such as to a baseband frequency at which one or more of the components of the CD 112 operates), equalization, pre-equalization, metric generation, symbol mapping and/or de-mapping, automatic gain control (AGC) operations, and/or any other operations that may be performed by an AFE and/or PHY component within a communication device.

FIG. 2A is a diagram illustrating an embodiment 201 of one or more communication systems serviced using a LAN backbone within an automobile. Note that while an automobile is used in this embodiment 201, other examples could include any type of transportation vehicle (e.g., a truck, a bus, a taxi, a manually operated vehicle, an autonomous vehicle, etc.). Considering the example of an automobile, one or more input devices are implemented around round the automobile. The input devices may include cameras with capability to take still photos, capture video, etc. In another example, the input devices include Laser Illuminated Detection And Ranging (LIDAR) sensors that have capability to measure distance via limiting a target with a light source such as a laser and analyzing the reflected light. Generally, any of a number of different types of sensors that are configured to acquire information regarding the environment in which the automobile is may be implemented to provide an input signal for use by processor within the automobile to determine one or more characteristics of a physical environment around the automobile. The automobile includes an integrated LAN backbone, one or more processors, etc.

In one example, the automobile includes an automotive control system and a number of cameras implemented within the vehicle to capture at least one of photographic or video information of a physical environment around the automobile. These camera(s) generate input signal(s) based on the at least one of photographic or video information and provides the input signal(s) to processor(s) implemented within the automobile. The input signals from the cameras may pass through respective transducers to generate signals that are compliant for transmission via the integrated LAN backbone to the processor(s). The automobile also includes a user interface (e.g., a video screen, a monitor, a navigation screen, a navigation system, a global positioning system (GPS) system, and/or audio speakers, etc.) configured to receive input and/or provide output to a user of the automobile. For example, the user interface receives the control signal from the second transducer and generates and outputs information corresponding to the physical environment around the automobile based on the control signal. This information may inform a user of the automobile regarding the physical environment around the automobile.

In another example, the automobile includes an automotive control system and one or more laser illuminated detection and ranging (LIDAR) sensors that determines a characteristic that corresponds to a physical environment around the automobile. The LIDAR sensor(s) generate signal(s) based on the characteristic and provides the input signal(s) (e.g., directly or via transducers) to the processor(s) by way of the integrated LAN backbone. The automotive control system that includes LIDAR sensor(s) may also include a user interface as described just above for use to receive input and/or provide output to a user of the automobile.

In yet another example, the control system is implemented within an autonomous vehicle. The inputs to such a control system within an autonomous vehicle may include camera(s), LIDAR sensor(s), etc. An autonomous vehicle include one or more actuators configured to receive control signal(s) (e.g., directly or from transducers) and to adapt operation of the autonomous vehicle based on the control signal(s). For example, the actuator(s) may be implemented to control any one of the accelerator pedal, the brake pedal, the steering wheel, the climate control within the vehicle such as air-conditioning or heating, tinting of windows, and/or any other adjustable, configurable, or adaptive element within the autonomous vehicle. Note that such an autonomous vehicle may include capability for manual override of any element by a user of the automobile.

FIG. 2B is a diagram illustrating an embodiment 202 of one or more communication systems serviced using a LAN backbone within an aircraft. In this example, one or more processors 110 is/are implemented to receive communication from various elements and to provide other communications to actuators that effectuate the position, status, condition, etc. of one or more control elements within an aircraft flight control system implemented within the aircraft. Examples of elements that provide input signals may include any one or more of an accelerometer, a gyroscope, a wind speed sensor, altimeter, a barometric pressure sensor, an optical sensor that detects light and/or darkness, and/or any other instrumentation the may be implemented within an aircraft. In one example, the control system includes one or both of an accelerometer or a gyroscope that generates input signal(s) based on one or both of acceleration and/or rotation of the aircraft and provides the input signal(s) to the first transducer provides the input signal(s) (e.g., directly or via transducers) to the processor(s) by way of the LAN backbone 116. After the processor(s) 110 have appropriately processed the input signal(s) and generated control signal(s), the processor(s) 110 transmit the control signal(s) (e.g., directly or via transducers) to actuator(s) that adapt position, status, condition, etc. of one or more flight control surfaces of the aircraft flight control system based on the control signal. For example, the actuator(s) may be implemented to control any one of the various flight control surfaces of the aircraft including an elevon (e.g., such as on a main or centrally located wing), a tail elevon, a tail rudder, and/or any other flight control surface. The actuator(s) may be implemented to control any one of the various flight control mechanism such as engine speed, any braking mechanism, and/or any other flight control mechanism. In general, the actuator(s) may be implemented to control any element of the aircraft that is part of the aircraft flight control system including any of those that may be governed by autopilot based operation.

Note also that other systems may be implemented within either the automobile FIG. 2 or the aircraft of FIG. 2B. For example, a first subsystem includes communications for a control system, a second subsystem includes communications for a media-based system for passengers, a third subsystem includes communications for pilot(s) and flight attendant(s), etc. Generally speaking, the LAN backbone 116 may be implemented to support communications based on an Ethernet communication protocol for one or more different communication systems within the automobile FIG. 2 or the aircraft of FIG. 2B.

Note also that the various devices within any of the systems and/or subsystems may be configured to process LDPC coded signals based on an LDPC code that is selected for compliance within a maximum latency tolerance of the respective system (e.g., control, communication, etc.) when supporting real-time operation and for use to compensate for AWGN, NBI, and/or impulse noise that may be deleteriously or adversely affecting the LAN backbone. Such operations may operate by using soft information generated during decoding of LDPC coded signal(s) to compensate for the AWGN, the NBI, and the impulse noise affecting the LAN backbone.

Various features within various types of systems (e.g., communication, control, etc.) are described in this disclosure. Certain description is provided and related to data rate and noise affected channels. Examples of such noise may include additive white Gaussian noise (AWGN), narrow-band interference (NBI), impulse noise, and/or any other types of noise and/or interference that may unfortunately degrade performance of one or more communication links within a communication system. Another consideration within communication systems is latency. Each device requires a finite amount of time to perform certain processing operations, and each signal requires a respective finite amount of time to propagate through one or more communication links within the communication system. Description is also provided herein related to constellation and mapping (e.g., mapping one or more bit or symbol labels to one or more constellation points within a constellation having a particular mapping).

Examples of forward error correction (FEC) consider herein include reference to classical Reed-Solomon (RS) codes and BCH (Bose and Ray-Chaudhuri, and Hocquenghem) codes as well as modern low density parity check (LDPC) type codes. Different respective size codes having different respective code rates are also consider herein. For example, size 2 k codes may be used for certain considerations including for lower latency and lower area and power. In other examples, size 3 k codes may be used for certain considerations including for bandwidth efficiency.

Data Rate and Channel

Certain of the examples presented herein operate based on an assumed data rate requirement of 1 Giga-bits per second (Gb/s) on payload data. In such an example, the rate on FEC coded data is as follows:

1. with 75% FEC: 1/0.75=1.33 Gb/s
2. w/ 90% FEC: 1/0.90=1.11 Gb/s

Different types of communication channel noises are considered including additive white Gaussian noise (AWGN), narrowband interference (NBI), and impulse noise (characterized as having a duration of 0.2 μs, and a burst SNR depicted as $SNR_{Burst}$)/

The AWGN channel noise at a particular time, k, may be described as follows:

AWGN channel noise at time k: $n(\sigma_{AWGN}, k)$ $$\sigma_{AWGN}: \text{noise variance} = \sqrt{\frac{P}{SNR_{AWGN}}},$$

$SNR_{AWGN}$: signal to noise ratio
P: average power of the modulation constellation $$pdf: f_{AWGN}(x) = \frac{e^{\frac{-x^2}{2\sigma_{AWGN}^2}}}{\sqrt{2\pi}\sigma_{AWGN}}$$

The NBI channel noise at a particular time, k, with an amplitude, A, may be described as follows:

$$NBI \text{ at time } k \text{ with an amplitude } A: n_I(A,k) = A\cos\left(\phi + \left[2\pi\left(\frac{f_c}{f_s}\right)k\right]\right)$$

$$RMS: \sigma_{NBI} = \frac{A}{\sqrt{2}},$$

Random phase carrier: $\phi \in [-\pi, \pi]$, Sampling/carrier frequency: $f_s/f_c$.

$$pdf: f_{NBI}(x) = \begin{cases} \frac{1}{\pi\sqrt{A^2 - x^2}} & |x| \leq A \\ 0 & \text{otherwise} \end{cases}$$

Latency

FIG. 3A is a diagram illustrating an example 301 of latency in a communication system. In this diagram, a first device at one end of one or more network segments based on a LAN backbone 116 and includes an encoder 352a and an interleaver 354a. The encoder 352a encodes one or more information bits to generate coded bits that undergo interleaving within the interleaver 354a (e.g., the first device is implemented independently or in conjunction with a transducer). The signal output from the interleaver 354a, or a signal based on that signal output from the interleaver 354a, is transmitted across the LAN backbone 116 to a second device at another end of the LAN backbone 116 that includes a de-interleaver 354b and a decoder 352b (e.g., the second device is implemented independently or in conjunction with a transducer). The de-interleaver 354b performs de-interleaving based on the type of interleaving performed within the interleaver 354a. Also, the decoder 352b performs decoding based on the type of encoding performed within the encoder 352a.

Different latencies are depicted as corresponding to different components and operations and network segments within the diagram. For example, a latency 1 may be viewed as being the period of time counting from the time of the first bit sent to the interleaving encoder to the time of the last bits input to the decoder. A latency 2 may be viewed as being the period of time counting from the time of the last the received bit to the decoder to the time the first bit output from the decoder.

With respect to the interleaving performed in the diagram, such interleaving may be performed using multiplexing and de-multiplexing (e.g., using de-mux such that no latency is required).

With respect to the encoding performed within the diagram, a systematic encoder may be used such that there is relatively little amount of latency, such as only a couple of cycle time latency (e.g., an assumption of approximately 0.02 μs at most latency will be accurate for most applications). While some applications may be able to accommodate use non-systematic encoding, those applications with design constraints of low latency, faster speed, etc. may benefit from using systematic encoding. In general, either non-systematic or systematic encoding may be used in different examples. The first and/or second devices include circuitry, functionality, capability, etc. to process LDPC coded signals based on an LDPC code that is selected for compliance within a maximum latency tolerance of the system (e.g., control, communication, etc.) when supporting real-time operation and for use to compensate for the AWGN, the NBI, and the impulse noise affecting the LAN backbone. An example of a maximum latency tolerance is 0.02 μs in one example. Other applications include higher or lower maximum latency tolerances of greater or less durations. The maximum latency tolerance may be defined as a percentage of a percentage of a cycle time (e.g., X %, where X may be 1, 2, 5, 10, etc.). The LDPC code is selected to ensure that the maximum latency tolerance constraint is met when operating the system. Note that some LDPC codes may not be able to meet the maximum latency tolerance constraint, and an appropriate selected LDPC does meet the maximum latency tolerance constraint and is used for the communications within the system.

Figure 3B:
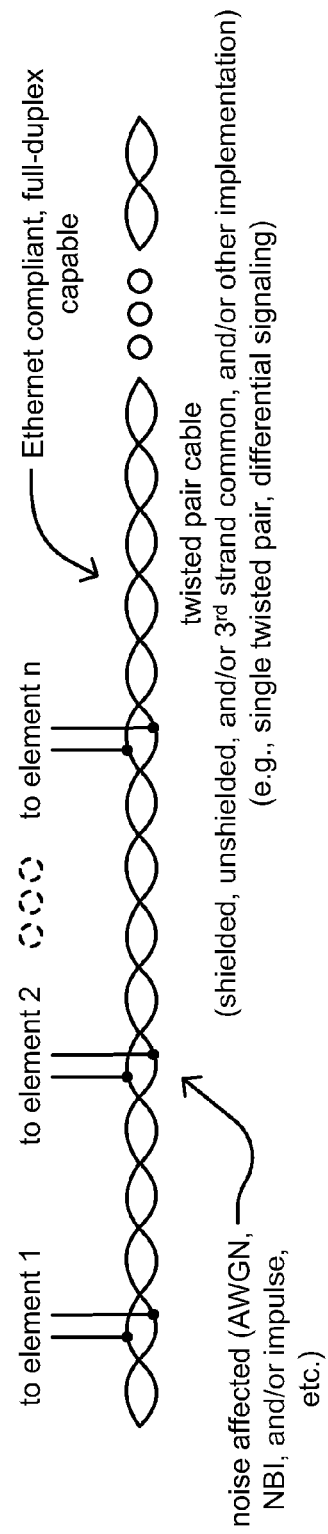
FIG. 3B is a diagram illustrating an example of a twisted pair cable for use as a LAN backbone.

FIG. 3B is a diagram illustrating an example 302 of a twisted pair cable for use as a LAN backbone. The LAN backbone that is based on the Ethernet communication protocol includes a twisted pair (e.g., a single twisted pair in some examples) that supports full-duplex communications of any elements (e.g., processor(s), sensor(s), actuator(s), communication device(s), etc.). The twisted pair can be shielded, unshielded, and/or include a $3^{rd}$ strand common strand and/or ground strand. Generally, such a .twisted pair can be implemented in any number of ways including as a single twisted pair. The twisted pair has connections and/or couplings via both of the differential strands to any elements (e.g., to element 1, element 2, up to element n, etc.). The LAN backbone may be susceptible to one or more of these types of noises, interferences, etc. (e.g., AWGN, NBI, and/or impulse noise). Such a LAN backbone that is based on the Ethernet communication protocol includes a single twisted pair may be configured to within a 1000Base-T1 based system or any other system that includes at least one single twisted pair.

Constellation and Mapping

Figure 4:
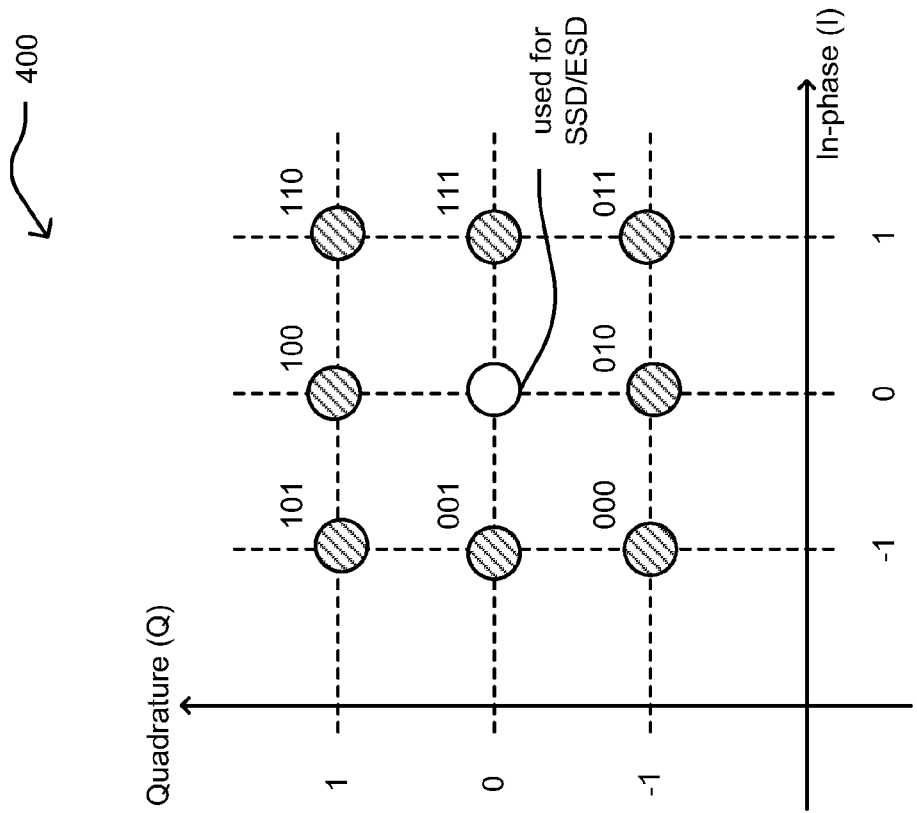
FIG. 4 is a diagram illustrating an example of constellation and mapping.

FIG. 4 is a diagram illustrating an example 400 of constellation and mapping. Pulse amplitude modulation (PAM)-2 (PAM-2) and PAM-3 are considered. Note that PAM-3 results are discussed specifically in this disclosure. The PAM-3 constellation and mapping are depicted in the diagram.

Classical FEC Codes

Certain characteristics of classical FEC codes are described below. Binary BCH codes operate well for correcting random bit errors. Other codes, such as m-bit RS (Reed-Solomon) codes operate as MDS (maximal distance separate) codes, and operate well for correcting m-bits burst.

With respect to decoding, bounded distance hard-decision (HD) decoding may be performed. This may be performed using 'threshold detector' to estimate PAM symbol. Decoding may be performed on m-bit symbol with the minimum distance. Note that certain examples may be unable to take advantage of the soft information of received signals.

In certain implementations, soft-decision decoding may not be practical and/or very well developed for these classical FEC codes described above and may be unable to meet many of the problems encountered with respect to the types of noise and/or interference described herein and that may be included within communication systems.

Modern FEC: LDPC Codes

One particular type of signal that is processed according to certain examples and/or embodiments is an LDPC coded signal. A general description of LDPC codes is provided below as well.

FIG. 5A illustrates an example 501 of an LDPC (Low Density Parity Check) code bipartite graph. An LDPC bipartite graph is sometimes referred to as a "Tanner" graph. An LDPC bipartite graph is a pictorial representation of an LDPC matrix of a corresponding LDPC code, and it shows the relationship of non-null elements of the LDPC matrix that performs bit or variable edge message updating (based on columns of the LDPC matrix) and check message updating (based on rows of the LDPC matrix). An LDPC code is characterized by a binary parity check matrix (i.e., LDPC matrix) that is sparse, such that nearly all of the elements of the matrix have values of zero ("0"). For example, $H=(h_{i,j})_{M \times N}$ is a parity check matrix of an LDPC code with block length N. The LDPC bipartite graph, or "Tanner" graph, is a pictorial illustration of an LDPC matrix.

LDPC codes are linear block codes and hence the set of all codewords $x \in C$ spans the null space of a parity check matrix, H, as follows:

$$Hx^T = 0, \forall x \in C \qquad (1)$$

For an LDPC code, the matrix, H, is a sparse binary matrix of dimension m×n. Each row of H corresponds to a parity check and a set element $h_{ij}$ indicates that data symbol j used for the parity check i. Each column of H corresponds to a codeword symbol.

For each codeword x, there are n symbols of which m are parity symbols. Hence the code rate of the LDPC code, r, is provided as follows:

$$r=(n-m)/n \qquad (2)$$

The row and column weights are defined as the number of set elements in a given row or column of H, respectively. The set elements of H are chosen to satisfy the performance requirements of the code. The number of 1's in the i-th column of the parity check matrix, H, may be denoted as $d_v(i)$, and the number of 1's in the j-th row of the parity check matrix may be denoted as $d_c(j)$. If $d_v(i)=d_v$ for all i, and $d_c(j)=d_c$ for all j, then the LDPC code is called a $(d_v, d_c)$ regular LDPC code, otherwise the LDPC code is called an irregular LDPC code.

A regular LDPC code can be represented as a bipartite graph by its parity check matrix with left side nodes representing variables of the coded bits (or alternatively as the "variable nodes" (or "bit nodes") 561 in a bit-based decoding of LDPC coded signals), and the right side nodes representing check equations (or alternatively as the "check nodes" 562). The bipartite graph (or Tanner graph) of the LDPC code defined by H may be defined by N variable nodes (e.g., N bit nodes) and M check nodes. Every variable node of the N variable nodes 561 has exactly $d_v(i)$ edges. As an example, edge 567 connects the variable node $v_i$ (or bit node $b_i$) 565, to one or more of the check nodes (within the M check nodes). The edge 567 is specifically shown as connecting from the variable node $v_i$ (or bit node $b_i$) 565, to the check node, $c_j$ 566. This number of $d_v$ edges (shown as $d_v$ 563) may be referred to as the degree of a variable node i. Analogously, a check node of the M check nodes 562 has $d_c(j)$ edges (shown as $d_c$ 564) connecting this node to one or more of the variable nodes (or bit nodes) 561. This number of edges, $d_c$ 564, may be referred to as the degree of the check node j.

An edge 567 between a variable node $v_i$ (or bit node $b_i$) 565 and check node, $c_j$ 566 can be defined by e=(i, j). Alternatively, given an edge e=(i, j), the nodes of the edge may alternatively be denoted as by e=(e),c(e)) (or e=(b(e), c(e))). The edges in the graph correspond to the set elements of H where a set element $h_{ji}$ indicates that an edge connects a bit (e.g., variable) node i with parity check node j.

Given a variable node $v_i$ (or bit node $b_i$), one may define the set of edges emitting from the node $v_i$ (or bit node $b_i$) by $E_v(i)=\{e|v(e)=i\}$ (or by $E_b(i)=\{e|b(e)=i\}$); these edges are referred to as bit edges, and the messages corresponding to these bit edges are referred to as bit edge messages.

Given a check node one may define the set of edges emitting from the node $c_j$ by $E_c(j)=\{e|c(e)=j\}$; these edges are referred to as check edges, and the messages corresponding to these check edges are referred to as check edge messages. Continuing on, the derivative result will be $|E_v(i)|=d_v$ (or $|E_b(i)|=d_b$) and $|E_c(j)|=d_c$.

Generally speaking, any such codes (e.g., LDPC codes) that can be represented by a bipartite graph may be characterized as a graph code. It is also noted that an irregular LDPC code may also be described using a bipartite graph. However, the degree of each set of nodes within an irregular LDPC code may be chosen according to some distribution. Therefore, for two different variable nodes, $v_{i_1}$ and $v_{i_2}$, of an irregular LDPC code, $|E_v(i_1)|$ may not be equal to $|E_v(i_2)|$. This relationship may also hold true for more than one (e.g., two) check nodes.

Note that terminology such as that of "bit node" and "bit edge message", or equivalents thereof, may be used in the art of LDPC decoding. With respect to LDPC decoding, note that "bit node" and "bit edge message" are alternatively referred to as "variable node" and "variable edge message", respectively. Note that LDPC decoding operates to make one or more estimates of the bit values (or variable values) encoded within an LDPC coded signal.

Note also that the various examples and embodiments described herein may also be applicable to non-binary LDPC codes. Binary LDPC codes generally may be described as being implemented on a bit-basis. Non-binary LDPC codes generally may be described as being implemented on a symbol-basis (e.g., where a symbol may include more than one bit). Generally, non-binary LDPC codes are based on symbols on a Galois field. For example, many of the computations performed within such LDPC coding processing can be described alternatively in the context of a finite field (e.g., a Galois field). Consider a finite field (Galois field) GF(q), where $q=p^m$ and p is a prime number and integer m>0. Let α be a primitive element of this field. Then, the Galois field may be defined as follows:

$$GF(q)=\{0, \alpha, \ldots, \alpha^{q-1}\}$$

As an example, consider that Q is the Galois field order of symbols of an LDPC code, then each symbol would have 2^Q or $2^Q$ bits. As a specific example, consider that 4 is the Galois field order of symbols of an LDPC code, then each symbol would have 2^4 or $2^4$ (or 16) bits. The principles and operations described in this disclosure may also be employed with and applied to non-binary LDPC codes.

FIG. 5B illustrates an example 502 of decoding of an LDPC coded signal. Within a processor (e.g., processor 110), a signal received from a communication channel undergoes appropriate demodulation (e.g., processing within an analog front end including digital sampling, digital to analog conversion, filtering, frequency conversion (up or down), gain adjustment and/or scaling, etc.) to generate a received bit sequence. Then, a metric generator 571 calculates log-likelihood ratios (LLRs) for each bit location within the received bit sequence. These LLRs correspond initially to the bit nodes 561 of the LDPC code and its corresponding LDPC bipartite graph that represents the LDPC matrix used to decode the signal.

In an example of LDPC decoding, during initialization, the LLRs are employed for the bit edge messages (e.g., extrinsic information) of the edges extending from the respective bit/variable nodes. Thereafter, one or more decoding cycles or iterations may be performed based on check node processing and bit node processing (iterative decoding 572). Check node processing or check node updating is performed using the original bit edge messages (e.g., the calculated LLRs) such as by a check node processor 574. A bit/variable node processor 573 then uses these updated check edge messages to perform bit node processing or bit node updating to update the variable node soft information for use in the next decoding iteration. The most recently updated variable bit/node soft information is then used to calculate the variable node edge messages (extrinsic information) for this next decoding iteration. The check node processor 574 performs check message updating (based on rows of the LDPC matrix) to generate updated check edge messages, and the bit/variable node processor 573 performs bit or variable edge message updating (based on columns of the LDPC matrix) as also described with reference to FIG. 5A.

When more than one decoding iteration is performed, these variable node edge messages are then used by the check node processor 574 for subsequent check node processing or check node updating to calculate updated check edge messages. Then, bit/variable node processor 573 uses the most recently updated check edge messages to perform bit node processing or bit node updating to update the variable node soft information once again. After a final decoding iteration, which may be determined based on some parameter (e.g., a predetermined number of decoding iterations or when all syndromes of the LDPC code equal zero, as determined by syndrome calculator 576), the last calculated variable node soft information may undergo hard limiting (e.g., in a slicer or hard limiter 575) to generate one or more estimates of one or more bits encoded within the LDPC coded signal.

Generally speaking, this approach for decoding of LDPC coded signals may be referred to as a message passing approach (or iterative message passing approach). Note that LDPC decoding may be performed in any of a variety of architectures including parallel decoding architectures, layer decoding architectures, etc. Processor 110 may be implemented to perform encoding and/or decoding of LDPC coded signal using any desired approach or architecture.

Note that the various functional blocks and components depicted in FIG. 5B may be implemented or performed by a processor (e.g., processor 110 (and memory 110a or memory 110b of FIG. 1A, processor(s) implemented in communication device 112 of FIG. 1A, any of the transducers of FIG. 1B, etc.). For example, the processor can be implemented to perform such decoding operations and an associated memory can be implemented to store and perform memory management for the various bit/variable and check edge messages, variable bit/node soft information, extrinsic information, etc. used in the decoding operations.

In another example of operation, a processor operates to modify a first LDPC matrix to generate a second LDPC matrix for use to decode an LDPC coded signal that is generated based on puncturing of one or more parity bits from another LDPC coded signal.

FIG. 5C illustrates an example 503 of an LDPC matrix that is partitioned into sub-matrices. This diagram shows the relationship between an overall LDPC matrix and the individual sub-matrices therein that can be all-zero-valued sub-matrices and/or CSI (Cyclic Shifted Identity) sub-matrices, and the diagram shows the sub-matrix rows and sub-matrix columns of the LDPC matrix that correspond to the sub-matrix arrangement of the LDPC matrix. Note also that a generator matrix, corresponding to an LDPC matrix, may be employed to encode at least one information bit to generate a plurality of LDPC coded bits and/or an LDPC codeword (e.g., such as using back-substitution described below). A generator matrix, G, of an LDPC code has the following relationship with LDPC matrix, H: $GH^T=0$. An LDPC code may be defined or characterized by its LDPC matrix, H, and/or its generator matrix, G.

A processor may be configured to encode at least one information bit to generate the plurality of LDPC coded bits and/or an LDPC codeword. The processor then transmits the plurality of LDPC coded bits and/or the LDPC codeword, within an LDPC coded signal (e.g., directly, via a communication interface and/or via a transducer). The processor may be configured to generate the LDPC coded signal by appropriate modulation of the plurality of LDPC coded bits and/or the LDPC codeword (e.g., processing within an analog front end including digital to analog conversion, filtering, frequency conversion (up or down), gain adjustment, etc.).

A binary LDPC code may be fully described by its parity check matrix (i.e., its LDPC matrix). At the top of the diagram, the individual elements of an LDPC matrix, H, are shown:

$$H = \begin{bmatrix} h_{0,0} & h_{0,1} & \ldots & h_{0,n-1} \\ h_{1,0} & h_{1,1} & \ldots & h_{1,n-1} \\ \ldots & \ldots & \ldots & \ldots \\ h_{m-1,0} & h_{m-1,1} & \ldots & h_{m-1,n-1} \end{bmatrix}$$

where n is the number of bits in a codeword, m is the number of parity check equations of the LDPC code, and $h_{i,j}$ is either 0 or 1. An n-bit vector c (e.g., $c=(c_1, c_2, \ldots, c_N)$) is a codeword (i.e., of the LDPC code) if and only if $Hc^T=0$.

For such an LDPC code, the parity matrix H is also composed of a number of q-by-q (i.e., q×q) square sub-matrices as shown in the bottom portion of the diagram and also below:

$$H = \begin{bmatrix} S_{0,0} & S_{0,1} & \ldots & S_{0,N-1} \\ S_{1,0} & S_{1,1} & \ldots & S_{1,N-1} \\ \ldots & \ldots & \ldots & \ldots \\ S_{M-1,0} & S_{M-1,1} & \ldots & S_{M-1,N-1} \end{bmatrix}$$

where M=m/q, N=n/q, and each sub-matrix, $S_{i,j}$, thereof is a q-by-q sub-matrix that is either an all-zero-valued sub-matrix (i.e., in which all elements thereof are the value of zero "0", which is depicted by a blank or an empty sub-matrix or a sub-matrix with value of "−1" therein in the associated diagrams) or a CSI (Cyclic Shifted Identity) sub-matrix. A CSI sub-matrix S is characterized by a shift-value, λ(S), (e.g., a right shift value) such that the components of S are defined as follows:

$$s_{i,j} = \begin{cases} 1 & \text{if } i + \lambda(S) = j(\text{mod } q) \\ 0 & \text{otherwise} \end{cases}$$

for any i and j, with 0≤i<q and 0≤j<q. For example, the q-by-q identity matrix is itself a CSI matrix with a shift-value λ(S)=0 (i.e., a CSI sub-matrix with a cyclic shift of zero "0").

As can be seen, the LDPC matrix (as depicted in the lower portion of the diagram), includes various sub-matrix rows and sub-matrix columns. These sub-matrix rows and columns are based on the sub-matrix construction of the LDPC matrix (e.g., shown as sub-matrix rows 0 through M−1 and sub-matrix columns 0 through N−1). This disclosure presents various new designs of LDPC codes.

Note also the following with respect to such LDPC code matrix constructions. A given LDPC code may be a QC (quasi-cyclic)-LDPC code. The definition of such an (n, k) QC-LDPC code is provided as follows:
1. (n−k)-by-n parity check matrix H
2. H is expanded from a binary base matrix $H_b$ of size v-by-u
3. The base matrix $H_b$ is expanded by replacing each sub-matrix in the base matrix with a size z permutation matrix, and each a blank or "−1" negative with a size z zero matrix. The permutations used are circular right shifts as described above, and the set of permutation sub-matrices contains the size z identity matrix and circular right shifted versions of the identity matrix (i.e., CSI sub-matrices).

Because each permutation matrix is specified by a single circular right shift, the binary base matrix information and permutation replacement information can be combined into a single compact model matrix $H_{bm}$. The model matrix $H_{bm}$ is the same size as the binary base matrix $H_b$, with each binary entry (i,j) of the base matrix $H_b$ replaced to create the model matrix $H_{bm}$. Each 0 in $H_b$ is replaced by a blank or "−1" negative to denote a size z all-zero matrix, and each other sub-matrix in $H_b$ is replaced by a circular shift size p(i,j)≥0 (e.g., an entry of "−1" indicates an all-zero-valued sub-matrix, and any other entry such as 0, 1, 2, etc. indicates an identity sub-matrix (if entry is 0), a CSI sub-matrix based on a shift-value of 1 (if entry is 1), a CSI sub-matrix based on a shift-value of 2 (if entry is 2), etc. and so on for any desired cyclic shift-value). The model matrix $H_{bm}$ can then be directly expanded to the entire LDPC matrix, H.

Figures 6A, 6B:
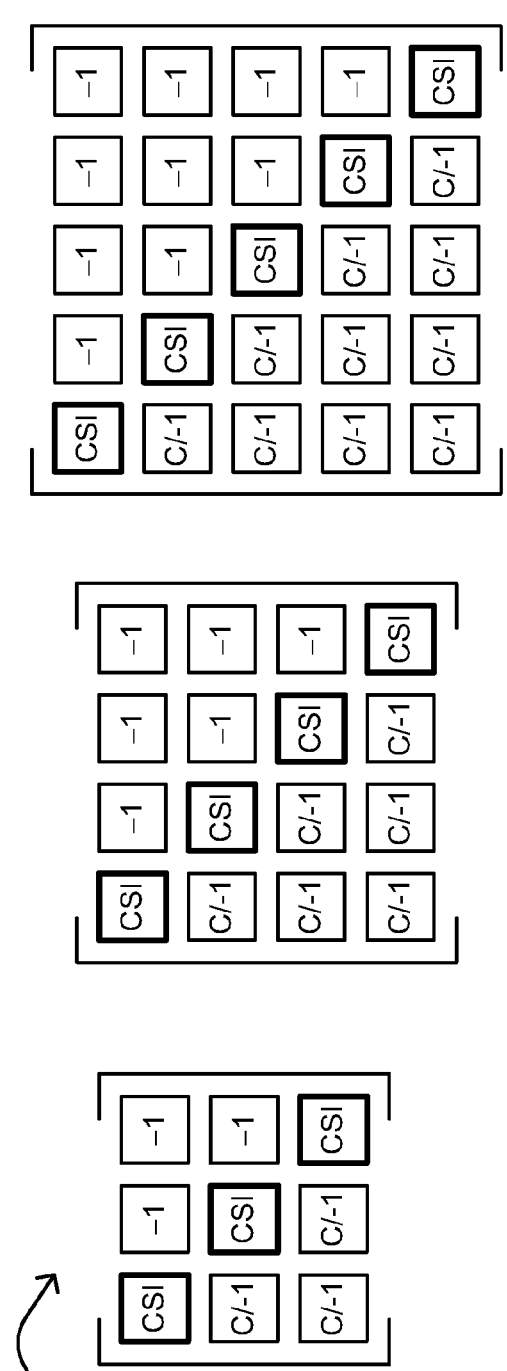
FIG. 6A is a diagram illustrating an example of an LDPC matrix partitioned into a left hand side matrix and a right hand side matrix.
FIG. 6B is a diagram illustrating examples of right hand side matrices of LDPC matrices.

FIG. 6A is a diagram illustrating an example 601 of an LDPC matrix partitioned into a left hand side matrix and a right hand side matrix. The parity matrix H of the bottom of FIG. 2C may be partitioned into a left hand side matrix, $H_{LHS}$, and a right hand side matrix, $H_{RHS}$. The partitioning will be in between two sub-matrix columns. This diagram shows the partitioning being between sub-matrix column x−1 and sub-matrix column x. Left hand side matrix, $H_{LHS}$, and right hand side matrix, $H_{RHS}$, include the same number of sub-matrix rows. In one implementation, the right hand side matrix, $H_{RHS}$, is a square matrix that includes a same number of sub-matrix rows and sub-matrix columns (e.g., the right hand side matrix, $H_{RHS}$, may generally be of any size such as z-by-z, where z is any desired number such as 2, 3, 4, 5, 6, 7, or even higher numbers etc.).

FIG. 6B is a diagram illustrating examples 602 of right hand side matrices of LDPC matrices. A right hand side matrix, $H_{RHS}$, having this form is lower triangular and includes all-zero-valued sub-matrices except for CSI (Cyclic Shifted Identity) sub-matrices located on a main diagonal of the right hand side matrix and certain one or more sub-matrices located below and to the left of the main diagonal of the right hand side matrix. The right hand side matrix is lower triangular and includes first all-zero-valued sub-matrices located above and to the right of the main diagonal of the right hand side matrix. First CSI (Cyclic Shifted Identity) sub-matrices are located on the main diagonal of the right hand side matrix, and second CSI sub-matrices and/or second all-zero-valued sub-matrices are located below and to the left of the main diagonal of the right hand side matrix. Those sub-matrices located below and to the left of the main diagonal of the right hand side matrix are depicted in the diagram as "C/−1" since each of them may be either a CSI sub-matrix or an all-zero-valued sub-matrix.

Note also that such CSI sub-matrices may be based on different CSI values. A CSI value of zero indicates an identity sub-matrix. A CSI value of 1 indicates an identity sub-matrix that has undergone a cyclic shift by 1. Any desired CSI value may be employed up to the sub-matrix size, z, if considering sub-matrices of size z-by-z. Generally speaking, a CSI value of x indicates an identity sub-matrix that has undergone a cyclic shift by x.

While examples have been provided showing LDPC decoding, a processor can also be configured to perform encoding of bit(s) to generate LDPC coded bit(s) and/or LDPC codeword(s). Such encoding maybe performed using back-substitution. An LDPC matrix may be partitioned into a left hand side matrix, $H_{LHS}$, and a right hand side matrix, $H_{RHS}$, such as shown in FIG. 6A. The right hand side matrix, $H_{RHS}$, can have the form of any of the right hand side matrices of FIG. 6B, and may be of any desired size such as 3-by-3, 4-by-4, 5-by-5, or generally of any size such as z-by-z, where z is any desired number such as 2, 3, 4, 5, 6, 7, etc.

Considering a right hand side matrix, $H_{RHS}$, having the form of those in FIG. 6B, a CSI sub-matrix may be a respective identity matrix that has either not been cyclic shifted (and remains an identity matrix) or a respective identity matrix that has been cyclic shifted by some amount as described above. For sub-matrices of size, L-by-L, input (information) bits, $c_{in}$, (k bits=L(n−m) bits), may be represented as follows: $c_{in}=(c_0, c_1, \ldots, c_{k-1})$ The processor then encodes the input (information) bits and computes L·m parity bits, $c_{par}$ (e.g., LDPC coded bits) as follows: $c_{par}=(c_k, c_{k+1}, \ldots c_{Ln-1})$ The processor then outputs the following:

$$c_P^T = \begin{pmatrix} C_0 \\ C_1 \\ C_2 \\ C_3 \\ C_4 \end{pmatrix}, \text{ where } C_i = (c_{L(n-m+i)}, c_{L(n-m+i)+1}, \ldots, c_{L(n-m+i)+L-1})^T.$$

For a right hand side matrix, $H_{RHS}$, in the form of those in FIG. 6B being of size 5-by-5 (e.g., where i varies from 0 to 4 in order of 0, 1, 2, 3, 4).

The encoding procedure may be described as follows:

Input: $c_I = (c_0, c_1, \ldots, c_{k-1})$

Step 1: compute $V_i = H_{I,i} c_I^T$, such that $i = 0, \ldots, 4$.

Step 2: back-substitution $$C_0 = V_0(L - u_{0,0})$$
$$C_1 = V_1(L - u_{1,1}) + C_0((L - u_{1,1} + u_{1,0}) \bmod L)$$
$$C_2 = V_2(L - u_{2,2}) + C_1((L - u_{2,2} + u_{2,1}) \bmod L)$$
$$C_3 = V_3(L - u_{3,3}) + C_2((L - u_{3,3} + u_{3,2}) \bmod L)$$
$$C_4 = V_4(L - u_{4,4}) + C_3((L - u_{4,4} + u_{4,3}) \bmod L)$$

Output: $c_P^T = \begin{pmatrix} C_0 \\ C_1 \\ C_2 \\ C_3 \\ C_4 \end{pmatrix}$

Note that this approach shows just one possible example by which encoding based on an LDPC code may be performed. Generally, the decoding operations described herein may be performed on an LDPC coded signal that is generated using any LDPC encoding approach.

Figure 7A:
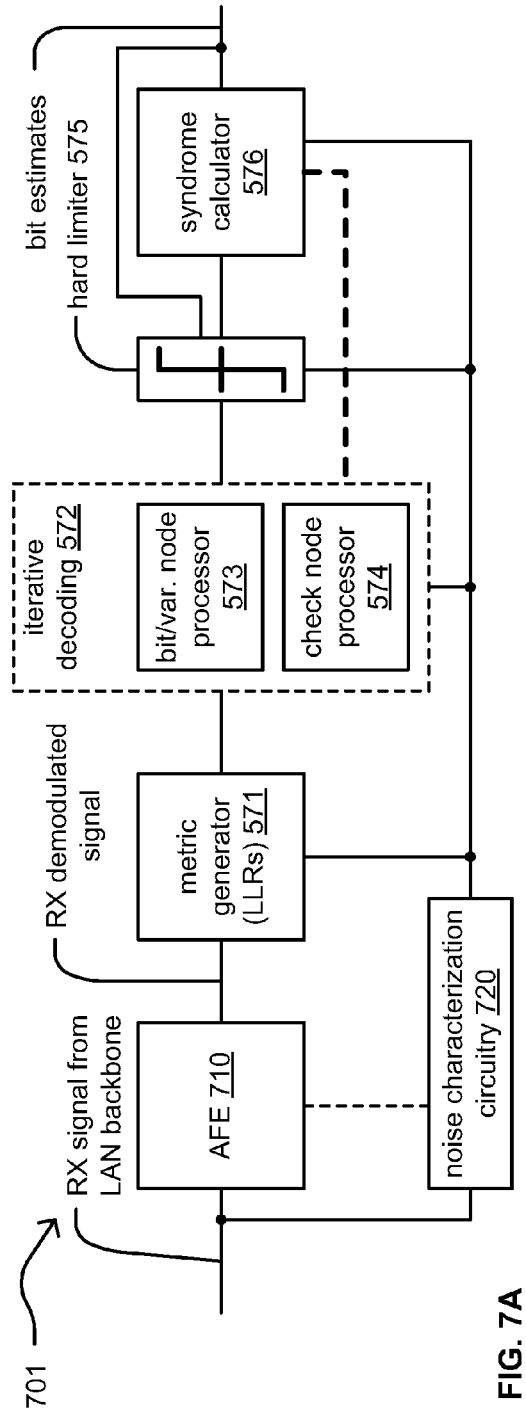
FIG. 7A illustrates an example of adaptive decoding of an LDPC coded signal using soft information.

FIG. 7A illustrates an example 701 of adaptive decoding of an LDPC coded signal using soft information. The example 701 includes many similarities to the example 502 of decoding of an LDPC coded signal. The example 701 includes an analog front end (AFE) 710 that receives a signal from an LAN backbone. The AFE 710 includes circuitry, functionality, and/or capability to perform any one or more of various operations including conversions between the frequency and analog or continuous time domains (e.g., such as the operations performed by a digital to analog converter (DAC) and/or an analog to digital converter (ADC)), gain adjustment including scaling, filtering (e.g., in either the digital or analog domains), frequency conversion (e.g., such as frequency upscaling and or frequency downscaling, such as to a baseband frequency at which one or more of the elements operates), equalization, pre-equalization, metric generation, symbol mapping and/or de-mapping, automatic gain control (AGC) operations, and/or any other operations that may be performed by an AFE and/or PHY component within the element.

The example 701 also includes a noise characterization circuitry 720 that can identify and characterize various types of noise and/or interference including additive white Gaussian noise (AWGN), narrowband interference (NBI), and/or impulse (sometimes referred to as burst) noise. In some examples, the noise characterization circuitry 720 performs filtering such as matched filtering based on known characteristics of such noises as AWGN, NBI, and/or impulse noise to detect and characterize those effects, digital signal processing, spectrum analysis capability, etc. to identify and characterize various types of noise and/or interference. Once identified and characterized, this information is provided for use within one or more of the various other decoding operations and processes when decoding an LDPC coded signal.

As described above, soft information is generated during decoding of an LDPC coded signal. Such soft information may be modified or adapted based on information related to the identified and characterized noise and/or interference (e.g., AWGN, NBI, impulse, and/or burst, etc.). Some examples of such modification and adaptation of such soft information may include any one or more of scaling of LLRs (e.g., up or down based on amount and/or location of noise and/or interference, selectively scale only certain LLRs and not others, selectively scale only LLRs within affected frequencies, sub-carriers (e.g., such as in an orthogonal frequency division multiplexing (OFDM) or OFDMA application), etc.), modification of various bit/variable and check edge messages, variable bit/node soft information, extrinsic information, etc. and/or other intermediate values that are used in the decoding operations including iterative decoding processing (e.g., over-write, changing, and/or ignoring of some soft information values, etc.), changing of hard decisions (e.g., over-write, changing, or ignoring of some hard decisions, etc.), adaptation of the number of decoding iterations to be performed, ignoring certain portions of a signal that have been deleteriously affected such as by performing erasure decoding, etc. Another example of such modification and adaptation may include adjusting any of these parameters only in some iterations and not in others. Another example of such modification and adaptation may include changing any intermediate result based on the identification and characterization of the noise and/or interference.

In general, the use of LDPC codes, and specifically the availability of soft information generated during decoding of LDPC coded signals, allows for the ability to compensate for AWGN, NBI, and/or impulse noise. Other types of FEC and/or ECC that do not operate based on generating soft information (e.g., such as those based on BCH (Bose and Ray-Chaudhuri, and Hocquenghem), Reed-Solomon (RS), etc. only generate hard decisions without any soft information) do not have such capability.

Figure 7B:
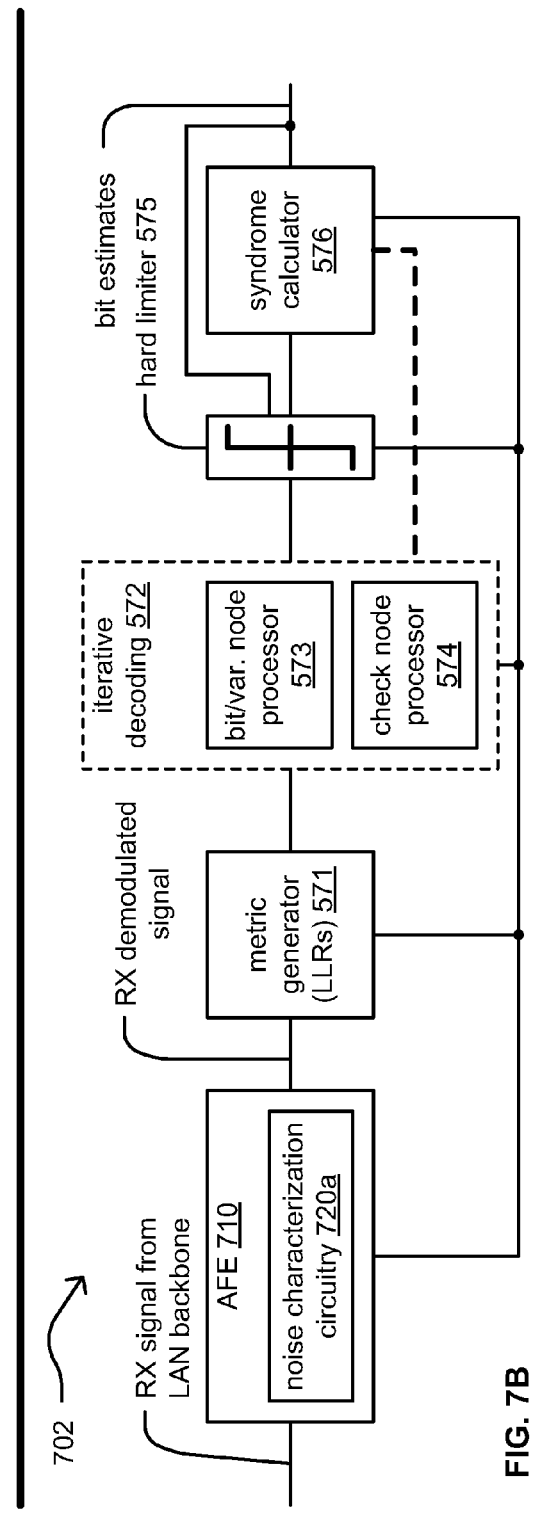
FIG. 7B illustrates another example of adaptive decoding of an LDPC coded signal using soft information.

FIG. 7B illustrates another example 702 of adaptive decoding of an LDPC coded signal using soft information. The example 702 also includes many similarities to the example 502 of decoding of an LDPC coded signal. The example 702 also includes the AFE 710 that receives a signal from an LAN backbone. However, in the example 702, noise characterization circuitry 720a is implemented within the AFE 710. In an example operation, the noise characterization circuitry 720a (e.g., similar to the noise characterization circuitry 720) operates to identify and characterize various types of noise and/or interference and to provide associated information to one or more of the various other decoding operations and processes when decoding an LDPC coded signal (e.g., such that soft information generated during decoding of an LDPC coded signal may be adapted based on that information as described above).

In even other examples, information related to the various types of noise and/or interference may be provided from other sources (e.g., such as being provided from an operator in the field who may be using portable instrumentation such as a spectrum analyzer, such as being provided from other elements in communication with the LAN backbone, such as based on prior or historical operational information, such as provided from simulations, etc.).

FIG. 8A is a diagram illustrating an embodiment of a method 801 for execution by one or more communication systems. The method 801 begins by receiving, via a local area network (LAN) backbone, a first low density parity check (LDPC) coded signal that is compliant with an Ethernet communication protocol (block 810). The LAN backbone supports communications based on the Ethernet communication protocol and is affected by additive white Gaussian noise (AWGN), narrowband interference (NBI), and/or impulse noise. In some instances, the LAN backbone is affected by AWGN, NBI, and impulse noise. In other instances, the LAN backbone is affected by AWGN, NBI, or impulse noise.

The method 801 continues by decoding the first LDPC coded signal to recover an input signal of a control system (block 820). This decoding of the first LDPC coded signal operates to generate soft information. In some examples, the method 801 also operates by using soft information generated during decoding of the first LDPC coded signal to compensate for the AWGN, the NBI, and the impulse noise affecting the LAN backbone (block 820a). Generally, the method 801 operates by employing the soft information to compensate for the AWGN, the NBI, and the impulse noise and to recover an input signal of a control system.

The method 801 then operates by processing the input signal to generate a control signal for the control system (block 830). The method 801 continues by encoding the control signal of the control system to generate a second LDPC coded signal that is compliant with the Ethernet communication protocol (block 840). The method 801 continues by transmitting the second LDPC coded signal via the LAN backbone (block 850).

FIG. 8B is a diagram illustrating another embodiment of a method 802 for execution by one or more communication systems.

The method 802 begins by processing an input signal of a control system to generate an LDPC coded signal (block 811). The method 802 continues by transmitting the LDPC coded signal via a LAN backbone (block 821). The LAN backbone is compliant with an Ethernet communication protocol and affected by AWGN, NBI, and/or impulse noise.

FIG. 8C is a diagram illustrating another embodiment of a method 803 for execution by one or more communication systems. The method 803 begins by receiving an LDPC coded signal an LDPC coded signal (block 812). The LAN backbone is compliant with an Ethernet communication protocol and affected by AWGN, NBI, and/or impulse noise. In some examples, the method 803 also operates by using soft information generated during decoding of the LDPC coded signal to compensate for the AWGN, the NBI, and the impulse noise affecting the LAN backbone (block 812a). The method 803 continues by decoding the LDPC coded signal to recover a control signal to adapt operation of a control system (block 824).

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "configured to," "operably coupled to," "coupled to," and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to," "operable to," "coupled to," or "operably coupled to" indicates that an item includes one or more of power connections, input(s), output(s), etc., to perform, when activated, one or more its corresponding functions and may further include inferred coupling to one or more other items. As may still further be used herein, the term "associated with," includes direct and/or indirect coupling of separate items and/or one item being embedded within another item.

As may be used herein, the term "compares favorably" or equivalent, indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

As may also be used herein, the terms "processing module," "processing circuit," "processor," and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

One or more embodiments of an invention have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

The one or more embodiments are used herein to illustrate one or more aspects, one or more features, one or more concepts, and/or one or more examples of the invention. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module includes a processing module, a processor, a functional block, hardware, and/or memory that stores operational instructions for performing one or more functions as may be described herein. Note that, if the module is implemented via hardware, the hardware may operate independently and/or in conjunction with software and/or firmware. As also used herein, a module may contain one or more sub-modules, each of which may be one or more modules.

While particular combinations of various functions and features of the one or more embodiments have been expressly described herein, other combinations of these features and functions are likewise possible. The present disclosure of an invention is not limited by the particular examples disclosed herein and expressly incorporates these other combinations.

What is claimed is:

1. A communication device comprising:
   a communication interface; and
   a processor configured to:
      receive, via the communication interface, a first low density parity check (LDPC) coded signal that is compliant with an Ethernet communication protocol via a local area network (LAN) backbone that supports communications based on the Ethernet communication protocol and that is affected by additive white Gaussian noise (AWGN), narrowband interference (NBI), and impulse noise;
      decode the first LDPC coded signal to generate soft information;
      employ the soft information to compensate for the AWGN, the NBI, and the impulse noise and to recover an input signal of a control system;
      process the input signal of the control system to generate a control signal for the control system to adapt operation of at least one other device that is implemented within the control system;
      encode the control signal of the control system to generate a second LDPC coded signal that is compliant with the Ethernet communication protocol; and
      transmit, via the communication interface, the second LDPC coded signal via the LAN backbone to the at least one other device that is implemented within the control system.

2. The communication device of claim 1, wherein the processor and the communication interface are further configured to:
   receive the first LDPC coded signal via the LAN backbone from a first transducer that is configured to:
      process the input signal of the control system to generate the first LDPC coded signal; and
      transmit the first LDPC coded signal via the LAN backbone; and
   transmit the second LDPC coded signal via the LAN backbone to a second transducer that is configured to:
      receive the second LDPC coded signal via the LAN backbone; and
      decode the second LDPC coded signal to recover the control signal for the control system to use to adapt operation of the control system.

3. The communication device of claim 2, wherein the control system includes an automotive control system implemented within an automobile that further comprises:
   a plurality of cameras configured to:
      capture at least one of photographic or video information of a physical environment of the automobile;
      generate the input signal based on the at least one of photographic or video information; and
      provide the input signal to the first transducer; and
   a user interface configured to:
      receive the control signal from the second transducer; and
      generate and output information corresponding to the physical environment of the automobile based on the control signal.

4. The communication device of claim 2, wherein the control system includes an automotive control system implemented within an automobile that further comprises:
   a laser illuminated detection and ranging (LIDAR) sensor configured to:
      determine a characteristic that corresponds to a physical environment of the automobile;
      generate the input signal based on the characteristic; and
      provide the input signal to the first transducer; and
   a user interface configured to:
      receive the control signal from the second transducer; and
      generate and output information corresponding to the physical environment of the automobile based on the control signal.

5. The communication device of claim 2, wherein the control system is implemented within an autonomous vehicle and further comprises:
- a laser illuminated detection and ranging (LIDAR) sensor configured to:
  - determine a characteristic of a physical environment of the autonomous vehicle;
  - generate the input signal based on the characteristic; and
  - provide the input signal to the first transducer; and
- an actuator configured to:
  - receive the control signal from the second transducer; and
  - adapt operation of the autonomous vehicle based on the control signal.

6. The communication device of claim 2, wherein the control system includes an aircraft flight control system implemented within an aircraft that further comprises:
- at least one of an accelerometer or a gyroscope configured to:
  - generate the input signal based on at least one of acceleration or rotation of the aircraft; and
  - provide the input signal to the first transducer; and
- an actuator configured to:
  - receive the control signal from the second transducer; and
  - adapt position of one or more flight control surfaces of the aircraft flight control system based on the control signal.

7. The communication device of claim 1, wherein the LAN backbone comprises a single twisted pair that supports full-duplex communications.

8. The communication device of claim 1, wherein the processor and the communication interface are further configured to:
- process the first and the second LDPC coded signals based on an LDPC code that is selected for compliance within a maximum latency tolerance of the control system when supporting real-time operation.

9. A communication device implemented within a transportation vehicle, the communication device comprising:
- a communication interface; and
- a processor configured to:
  - receive, via the communication interface, a first low density parity check (LDPC) coded signal that is compliant with an Ethernet communication protocol via a local area network (LAN) backbone that supports communications based on the Ethernet communication protocol and that is affected by additive white Gaussian noise (AWGN), narrowband interference (NBI), and impulse noise, wherein the first LDPC coded signal is based on an input signal that is generated by a sensor and that is based on an operational parameter of a control system of the transportation vehicle;
  - decode the first LDPC coded signal to generate soft information;
  - employ the soft information to compensate for the AWGN, the NBI, and the impulse noise and to recover the input signal of a control system;
  - process the input signal of the control system to generate a control signal for the control system to adapt operation of at least one other device including an actuator that is implemented within the control system;
  - encode the control signal of the control system to generate a second LDPC coded signal that is compliant with the Ethernet communication protocol; and
  - transmit, via the communication interface, the second LDPC coded signal via the LAN backbone for use by the actuator that is configured to use the control signal that is based on the second LDPC coded signal to adapt position of a control element of the control system of the transportation vehicle.

10. The communication device of claim 9, wherein:
the control system of the transportation vehicle includes an automotive control system implemented within an automobile; and
the sensor includes a camera configured to generate the input signal, wherein the operational parameter of the control system of the transportation vehicle includes at least one of photographic or video information of a physical environment of the automobile.

11. The communication device of claim 9, wherein:
the control system of the transportation vehicle includes an aircraft flight control system implemented within an aircraft;
the sensor includes at least one of an accelerometer or a gyroscope configured to generate the input signal, wherein the operational parameter of the control system of the transportation vehicle includes at least one of acceleration or rotation of the aircraft; and
the actuator configured to adapt position of one or more flight control surfaces of the aircraft flight control system based on the control signal.

12. The communication device of claim 9, wherein the LAN backbone comprises a single twisted pair that supports full-duplex communications.

13. The communication device of claim 9, wherein the processor and the communication interface are further configured to:
- process the first and the second LDPC coded signals based on an LDPC code that is selected for compliance within a maximum latency tolerance of the control system when supporting real-time operation.

14. A method for execution by a communication device, the method comprising:
- receiving, via a local area network (LAN) backbone, a first low density parity check (LDPC) coded signal that is compliant with an Ethernet communication protocol, wherein the LAN backbone supports communications based on the Ethernet communication protocol and is affected by additive white Gaussian noise (AWGN), narrowband interference (NBI), and impulse noise;
- decoding the first LDPC coded signal to generate soft information;
- employing the soft information to compensate for the AWGN, the NBI, and the impulse noise and to recover an input signal of a control system;
- processing the input signal of the control system to generate a control signal for the control system to adapt operation of at least one other device that is implemented within the control system;
- encoding the control signal of the control system to generate a second LDPC coded signal that is compliant with the Ethernet communication protocol; and
- transmitting the second LDPC coded signal via the LAN backbone to the at least one other device that is implemented within the control system.

15. The method of claim 14 further comprising:
receiving the first LDPC coded signal via the LAN backbone from a first transducer that is configured to:
process the input signal of the control system to generate the first LDPC coded signal; and
transmit the first LDPC coded signal via the LAN backbone; and
transmitting the second LDPC coded signal via the LAN backbone to a second transducer that is configured to:
receive the second LDPC coded signal via the LAN backbone; and
decode the second LDPC coded signal to recover the control signal for the control system to use to adapt operation of the control system.

16. The method of claim 15, wherein the control system includes an automotive control system implemented within an automobile that further comprises:
a plurality of cameras configured to:
capture at least one of photographic or video information of a physical environment of the automobile;
generate the input signal based on the at least one of photographic or video information; and
provide the input signal to the first transducer; and
a user interface configured to:
receive the control signal from the second transducer; and
generate and output information corresponding to the physical environment of the automobile based on the control signal.

17. The method of claim 15, wherein the control system includes an automotive control system implemented within an autonomous vehicle that further comprises:
a laser illuminated detection and ranging (LIDAR) sensor configured to:
determine a characteristic of a physical environment of the autonomous vehicle;
generate the input signal based on the characteristic; and
provide the input signal to the first transducer; and
an actuator configured to:
receive the control signal from the second transducer; and
adapt operation of the autonomous vehicle based on the control signal.

18. The method of claim 15, wherein the control system includes an aircraft flight control system implemented within an aircraft that further comprises:
at least one of an accelerometer or a gyroscope configured to:
generate the input signal based on at least one of acceleration or rotation of the aircraft; and
provide the input signal to the first transducer; and
an actuator configured to:
receive the control signal from the second transducer; and
adapt position of one or more flight control surfaces of the aircraft flight control system based on the control signal.

19. The method of claim 14, wherein the LAN backbone comprises a single twisted pair that supports full-duplex communications.

20. The method of claim 14 further comprising:
processing the first and the second LDPC coded signals based on an LDPC code that is selected for compliance within a maximum latency tolerance of the control system when supporting real-time operation.

* * * * *